United States Patent [19]

Matsutani

[11] Patent Number: 4,924,185

[45] Date of Patent: May 8, 1990

[54] MAGNET APPARATUS FOR USE IN MAGNETIC RESONANCE IMAGING SYSTEM

[75] Inventor: Kinya Matsutani, Yokohama, Japan

[73] Assignee: Kabushiki Kaisha Toshiba, Kawasaki, Japan

[21] Appl. No.: 328,460

[22] Filed: Mar. 24, 1989

[30] Foreign Application Priority Data

Mar. 25, 1988 [JP] Japan ................................. 63-69620

[51] Int. Cl.⁵ .......................................... G01R 33/20
[52] U.S. Cl. ....................................... 324/319; 324/318
[58] Field of Search ............... 324/300, 307, 309, 310, 324/311, 312, 313, 314, 315, 318, 322, 319; 128/653; 335/300

[56] References Cited

U.S. PATENT DOCUMENTS

| 4,701,736 | 10/1987 | McDougall et al. | 335/299 |
| 4,733,189 | 3/1988 | Pillsbury et al. | 324/318 |
| 4,837,541 | 6/1989 | Pelc | 335/300 |

FOREIGN PATENT DOCUMENTS

| 0067933 | 12/1982 | European Pat. Off. . |
| 0116364 | 8/1984 | European Pat. Off. . |
| 0122498 | 10/1984 | European Pat. Off. . |
| 63-272335 | 6/1988 | Japan . |
| 2149901 | 6/1985 | United Kingdom . |

OTHER PUBLICATIONS

Patent Abstracts of Japan, vol. No. 340 (E-455) (2396), Nov. 18, 1986; & JP-A-61 144 802 (Toshiba Corp.), 02.07.86.

Primary Examiner—Michael J. Tokar
Attorney, Agent, or Firm—Cushman, Darby & Cushman

[57] ABSTRACT

A magnet apparatus for use in magnetic resonance imaging systems comprises a superconducting coil which produces a main magnetic field in a working volume defined in the bore in which a patient is accommodated and a cryostat accommodating the superconducting coil and keeping the superconducting coil in the superconducting state. This cryostat includes only one thermal radiation shield and is configured with a smaller volume than that of conventional cryostats with no reduction in the heat insulation effects. Therefore, the dimensions of the bore are determined to comply with $1.0 \leq L/B < 1.9$ where L is the length along the Z axis of the bore and B is its diameter. Thus, the length L along the Z axis of the bore is determined to be relatively short while the dimensions of the working volume necessary for diagnosis is secured in the bore, with the result that the oppressive sensation that the patient has in the bore is lessened.

9 Claims, 6 Drawing Sheets

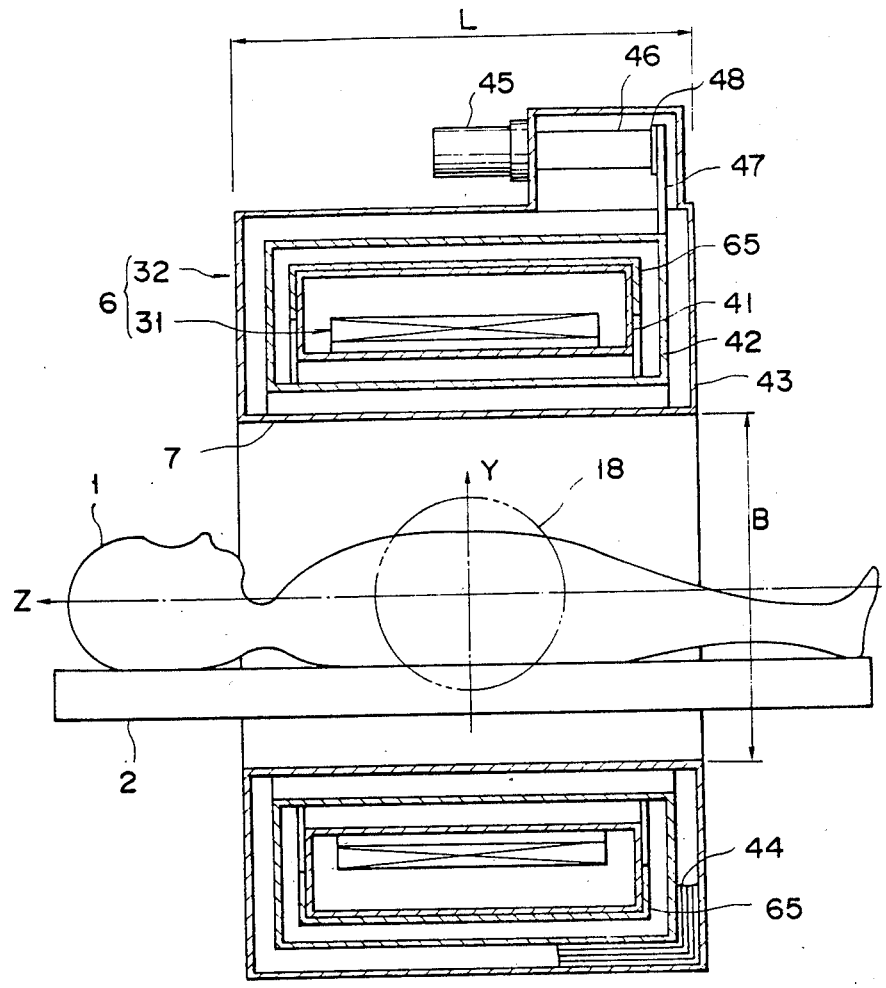
F I G. 4

MAGNET APPARATUS FOR USE IN MAGNETIC RESONANCE IMAGING SYSTEM

BACKGROUND OF THE INVENTION

1. Field of the Invention

This invention relates to a magnet apparatus for use in a magnetic resonance imaging system (MRI system) and more specifically to a magnet apparatus having a cryostat to keep a superconducting coil, which produces a static magnetic field, in the superconducting state.

2. Description of the Related Art

The MRI system has formed therein a bore to accommodate a patient. A working volume where the patient's part subject to diagnosis is placed is defined in the bore. A magnet apparatus is disposed surrounding the bore and comprises a superconducting coil to produce a static magnetic field in the working volume and a cryostat to hold the superconducting coil in the superconducting state. A gradient magnetic field is superposed on the static magnetic field and high frequency signals are applied to the patient's part subject to diagnosis. Magnetic resonance signals from that part of the patient are detected and used to form a tomographic image of the part for diagnosis.

Incidentally, the static magnetic field formed in the working volume is required to be high homogeneity. This has caused the superconducting coil to be made with a large volume, which led to the increased volume of the cryostat. Thus, the production costs of superconducting coils and cryostats have been pushed up substantially. As superconducting coils and cryostats are great in size and weight it is difficult to transport MRI systems and install these systems in the existing hospitals or the like.

Further, the whole body of the patient is accommodated in the long and narrow bore. Therefore, the patient has an oppressive sensation and often suffers from claustrophobia. While MRI diagnosis is in progress, the doctor cannot directly observe the patient. If, under such a situation, the patient's condition takes a sudden turn for the worse, the doctor is unable to take an emergency measure.

SUMMARY OF THE INVENTION

The object of this invention is to provide a magnetic apparatus for use in magnet resonance imaging systems, which has been reduced in size and weight and therefore can be transported and installed easily and can be manufactured at reduced cost and which has lessened the patient's sense of oppression.

According to the present invention, there is provided a magnet apparatus for use in magnetic resonance imaging systems, said magnet apparatus having an axis and a bore extending coaxially with the axis and adapted to accommodate an examined object, said bore having the length (L) parallel with the axis and the diameter (B), said magnet apparatus, comprising:

a superconducting magnet coil disposed coaxially with the axis and radially outside the bore and capable of producing a main magnetic field inside the bore; and a cryostat having a cylindrical wall which defines the bore such that the dimensions of the bore comply with $1.0 \leq L/B < 1.9$, accommodating the superconducting magnet coil and keeping the coil in the superconducting state, said cryostat including:

a helium chamber containing liquid helium, said helium chamber accommodating the superconducting coil immersed in the liquid helium, thereby keeping the superconducting coil in the superconducting state;

a vacuum container having a vacuum internal space in which said helium chamber is accommodated;

a thermal radiation shield disposed in the internal space of said vacuum container and surrounding said helium chamber; and means for cooling said thermal radiation shield to a specified temperature, whereby said thermal radiation shield cooperates with the internal space of said vacuum container to prevent the greater part of the radiant heat from entering said helium chamber from outside said vacuum container, the helium chamber being thus insulated from the radiant heat.

According to the present invention, as will be described in the Detailed Description of the Preferred Embodiment, the volume of the cryostat has been made smaller than before without reducing the heat-insulation effects of the helium chamber. To take an example, the volume of the cryostat is 50% of that of conventional cryostats. As a result, the bore can be designed to comply with the condition that $1.0 \leq L/B < 1.9$ where L is the length of the bore in parallel with the Z axis and B is the diameter of the bore. The reason why the range of the value of L/B has been determined will be mentioned in the Detailed Description of the Preferred Embodiment. The length L parallel with the Z axis of the bore has been defined to be relatively short while the dimensions of the working volume necessary for diagnosis are secured inside the bore. Consequently, the oppressive sensation of the patient in the bore is lessened.

Further, the cryostat has been reduced in size and weight. Therefore, MRI systems can be easily transported and installed in the existing hospitals or the like. In addition, the production cost of the cryostat can be decreased.

BRIEF DESCRIPTION OF THE DRAWINGS

FIG. 4 is a vertical sectional view of the magnet apparatus according to a second modification of this invention;

DETAILED DESCRIPTION OF THE PREFERRED EMBODIMENT

Figure 1:
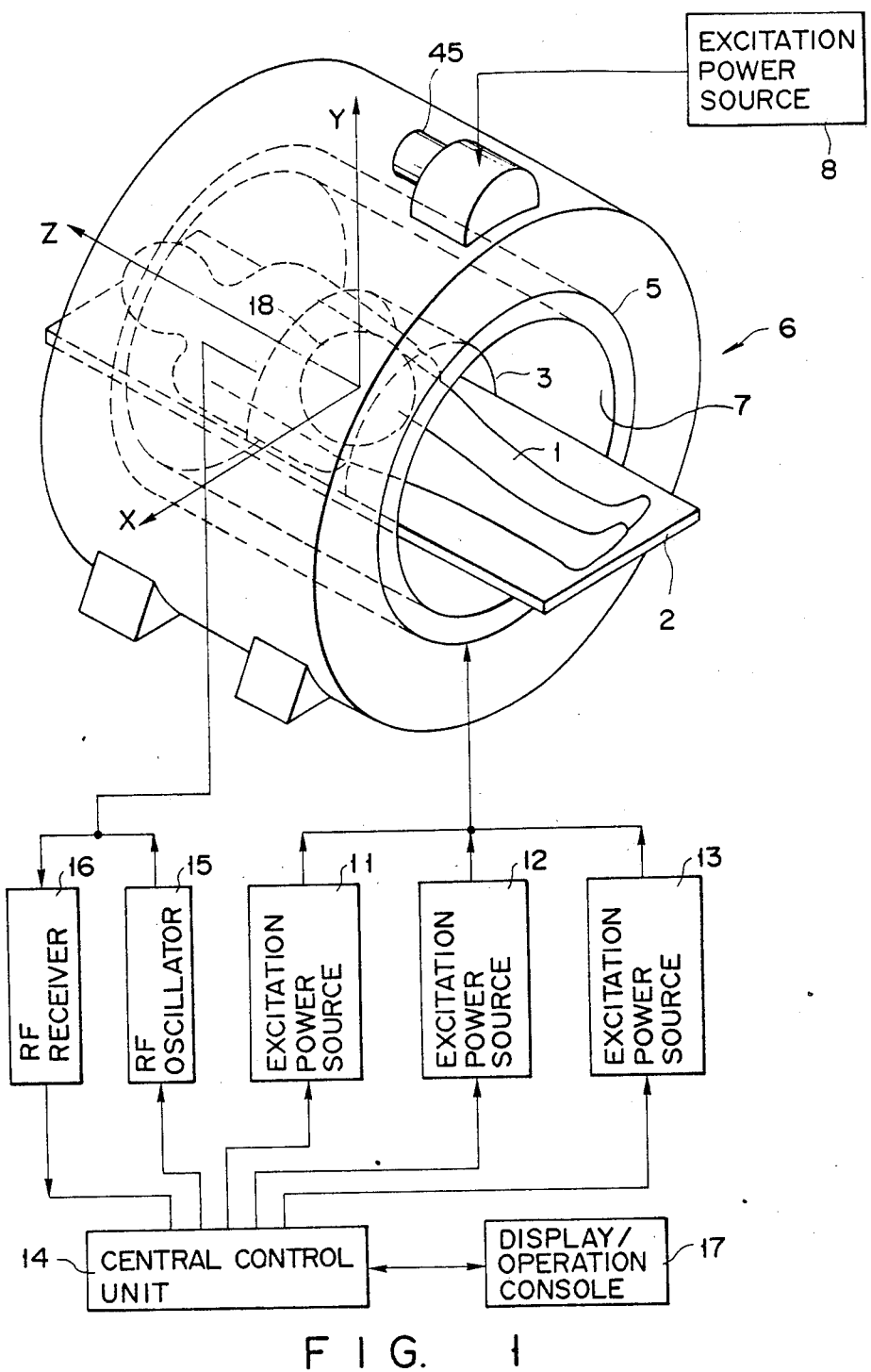
FIG. 1 is a perspective view and a block diagram of an MRI system.

FIG. 1 shows a magnetic resonance imaging system (MRI system) in which a magnet apparatus according to this invention is used. Patient 1 is accommodated in the bore lying on couch 2. The part subject to diagnosis of patient 1 is located in the working volume 18. Magnet apparatus 6 produces a static or a main magnetic field along the Z axis in working space 18. Magnet apparatus 6 is connected to excitation power source 8. X, Y and Z gradient magnetic field coils 5 are arranged radially inside magnet apparatus 6. These X, Y and Z gradient magnetic field coils 5 are respectively connected to excitation power sources 11, 12 and 13.

RF coil 3 is disposed surrounding the part subject to diagnosis of patient 1. RF coil 3 is connected to RF oscillator 15 and RF receiver 16. RF oscillator/receiver 15, 16 and excitation power sources 11, 12 and 13 are connected to central control unit 14. This control unit 14 is connected to display/operation console 17.

When excited, magnet apparatus 6 produces a uniform magnetostatic field in the working volume. Under this condition, the X, Y and Z gradient magnetic fields produced by X, Y and Z gradient magnetic coils 5 are superposed on the static magnetic field. At the same time RF oscillator 15 is driven according to a pulse sequence, pulse signals are sent to RF coil 3. Thus, magnetic resonance signals are induced in the patient's part under diagnosis. These magnetic resonance signals are detected by RF coil 3 and sent through RF receiver 16 to central control unit 14, which performs the image reproduction process and provides image information. This image information is converted into video signals which are used to display a tomographic image on display console 17.

Figure 2:
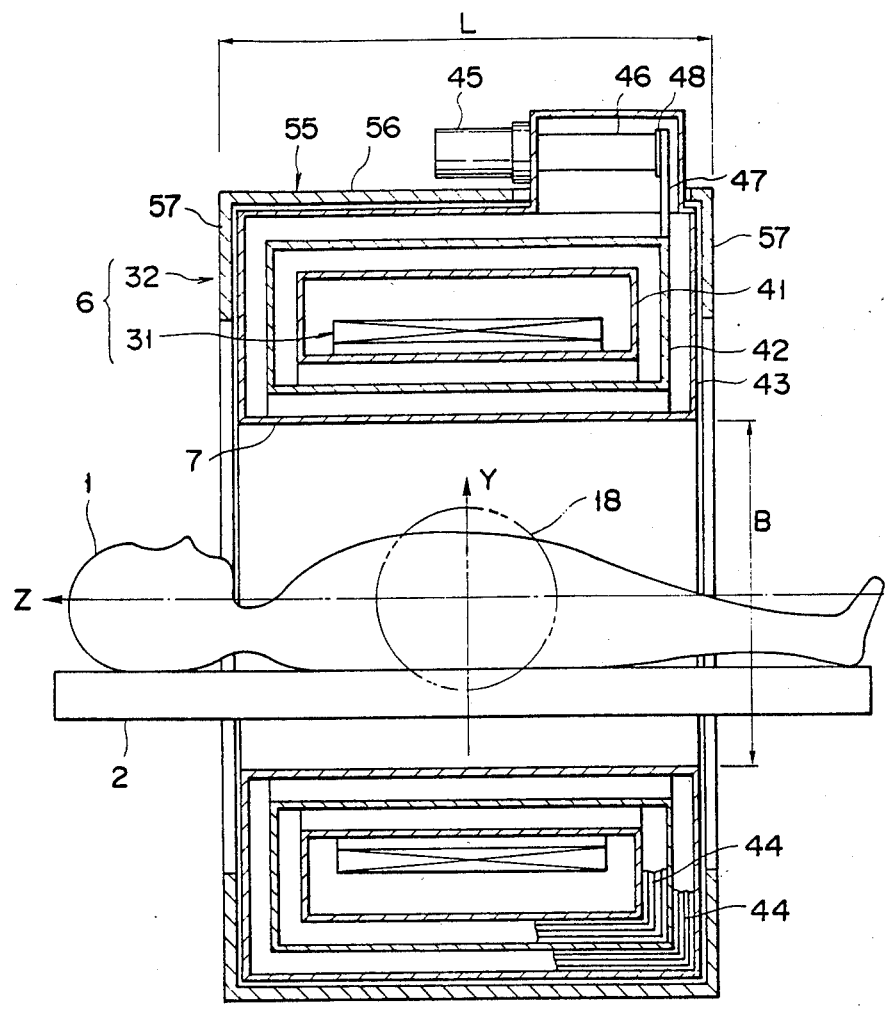
FIG. 2 is a vertical sectional view of the magnet apparatus according to this invention.

Referring to FIG. 2, the magnet apparatus according to this invention will now be described.

Magnet apparatus 6 comprises superconducting coil 31 for producing a static or a main magnetic field in working volume 18 and cryostat 32 to keep magnet coil 31 in the superconducting state.

Cryostat 32 includes helium chamber 41 containing liquid helium at a temperature of 4.2K. In this helium chamber 41, superconducting coil 31 is immersed with liquid helium and kept in superconducting state. Helium chamber 41 is covered by single thermal radiation shield 42. Cryostat 32 also further includes vacuum container 43 having an internal space held in a vacuum. Both helium chamber 41 and thermal radiation shield 42 are accommodated in the internal space. Multiple layer heat insulating material 44 is arranged also in the internal space. Vacuum container 43 comprises a cylindrical wall which defines bore 7.

Cryostat 32 comprises means for cooling thermal radiation shield 42. The cooling means is constituted of a refrigerator having a single refrigeration stage. The cooling means comprises refrigerator 45 provided at the top of vacuum container 43, cylinder 46 having one end connected to refrigerator 45 and another end, and single refrigeration stage 48 connected to another end of cylinder 46 and connected through heat transfer plate 47 to thermal radiation shield 42. The refrigerant cooled by refrigerator 45 is adiabatically expanded in cylinder 46. Thus, refrigeration stage 48 is cooled to the temperature of 30K. Refrigeration stage 48 takes the heat through heat transfer plate 47 from radiation shield 42. Consequently, radiation shield 42 is cooled to 30K and kept at this temperature.

In this manner, thermal radiation shield 42, the internal space and heat insulating material 44 of vacuum container 43, cooperating with one another, prevent the radiant heat from entering helium chamber 41. Thus, helium chamber 41 is insulated from the radiant heat and the temperature in helium chamber 41 is kept at 4.2K.

The conventional cryostat will now be described briefly. The conventional cryostat comprises an inner thermal radiation shield enclosing a helium chamber and connected to a refrigeration stage of 20K and an outer thermal radiation shield enclosing the inner shield and connected to a refrigeration stage of 80K. The inner and outer shields are cooled continuously at 20K and 80K, respectively, and cooperate with the internal space of the vacuum chamber to cut off the radiant heat. However, the cryostat, having two shields, is relatively large in volume. This results in the relatively long bore and the relatively great sense of oppression that the patient has.

In contrast, according to the present invention, cryostat 32 includes single thermal radiation shield 42. Therefore, cryostat 32 can be designed to have a small volume. The surface area of the cryostat can be made smaller than before, accordingly. As a result, the amount of radiant heat that may enter the helium chamber through the surface of the cryostat can be made smaller than in conventional cryostats. Therefore, the cryostat, though with only one thermal radiation shield, exerts sufficient heat insulation effects to insulate the helium chamber from the heat. In other words, the cryostat can be decreased in volume without reducing the heat insulation effects of the helium chamber. For example, the volume of the cryostat of this invention is half that of the conventional cryostat.

Further, thermal radiation shield 42 is cooled by refrigerator 45 with a single refrigeration stage. For this reason, the refrigerant such as liquid nitrogen which is conventionally used to cool the thermal radiation shield is not required. Thus, the container to store the refrigerant can be done away with and therefore the volume of the cryostat can be further decreased.

According to this invention, the cryostat has a reduced volume. Therefore, the bore dimensions may be determined to conform to the condition that $1.0 \leq L/B < 1.9$ where L is the length along the Z axis of bore 7 and B is its diameter. The L/B is determined for the reasons described below. It is considered that the required diameter of the working volume for diagnosis is 100 cm. Therefore, the L needs to be more than or equal to 100 cm. The B may be about 100 cm. Meanwhile, in order to lessen the sense of oppression that the patient has in bore 7, the L needs to be less than 190 cm. From the foregoing, we have: 100 cm $\leq$ L < 190 cm. Therefore, (100 cm/100 cm) $\leq$ L/B < (190 cm/100 cm). That is, $1.0 \leq L/B < 1.9$. Thus, the length L along the Z axis of the bore is designed to be relatively short while the working volume necessary for diagnosis is secured in the bore. As a result, the patient's oppressive sensation is lessened.

Further, the cryostat is reduced both in volume and weight. This makes it easy to transport MRI systems and install them in the existing hospitals or the like. The production cost of cryostats is also decreased.

Yoke magnetic shield 55 is mounted outside vacuum container 43. This yoke magnetic shield 55 is constituted of cylindrical shell 56 fixed to the outer periphery of vacuum container 43 and a pair of disc-like members 57 fixed to the opposite ends walls of vacuum container 43. This yoke magnetic shield 55 serves to absorb the flux of the magnetic fringe field leaked to the outside from inside bore 7. In this manner, the magnetic fringe field is reduced. Cylindrical shell 56 is divided by the mid-plane of the magnet apparatus perpendicular to the Z axis into two segments. When transported, the yoke magnetic shield is thus divided.

According to this invention, since the cryostat is formed to have a relatively small volume, yoke magnetic shield 55 small in size and weight. Yoke magnetic shield 55 is positioned much closer to superconducting coil 31 than in the conventional apparatus. Therefore, this yoke magnetic shield can cover the magnetic fringe field more efficiently than before.

As described above, in this invention, the volume of the cryostat is made smaller than before with no reduction in the heat insulating effects of the helium chamber. Therefore, the bore can be designed to have dimensions that comply with $1.0 \leq L/B < 1.9$. Thus, the length L along the Z axis of the bore is determined to be relatively short. In consequence, the patient's trepidation in bore 7 is eased.

Figure 3:
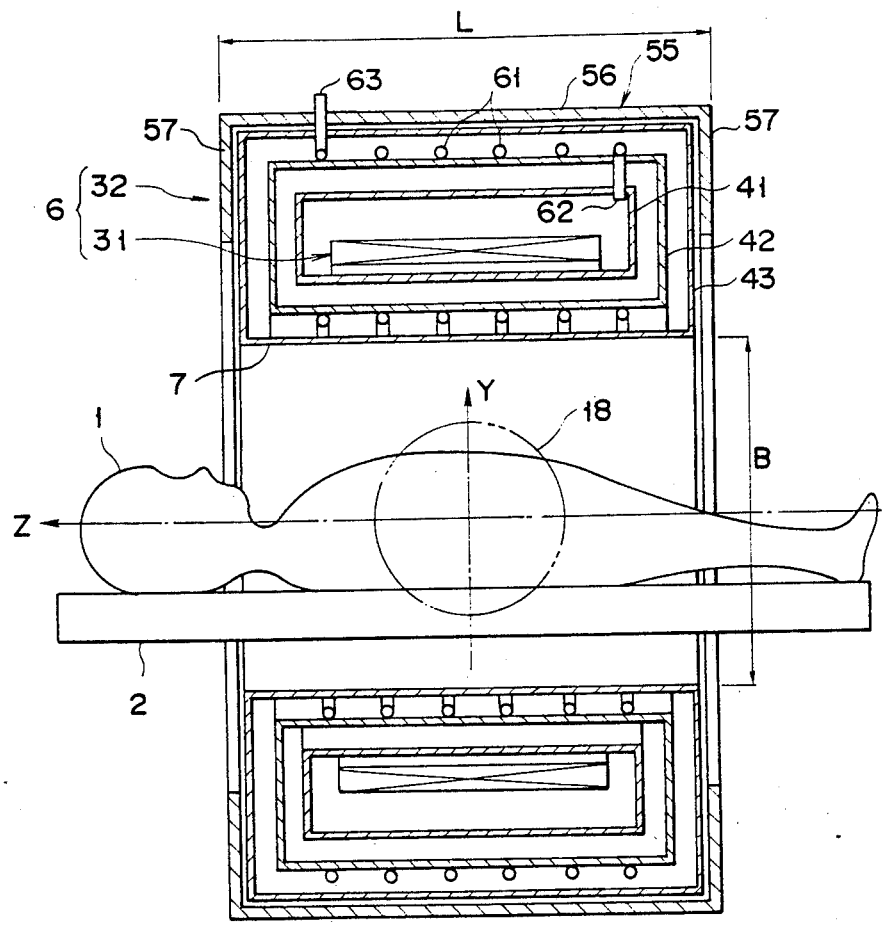
FIG. 3 is a vertical sectional view of the magnet apparatus according to a first modification of this invention.

Referring to FIG. 3., a first modification of the present invention will be described.

In this modification, the cooling means for cooling the thermal radiation shield comprises tube 61 wound around the external circumferential surface thereof. Tube 61 is open at one end 62 in helium chamber 41 and at the opposite end 63 to the outside of vacuum container 43.

The helium evaporated in helium chamber 41 passes through tube 61 and is vented to the outside of vacuum container 43. The temperature of the evaporated helium is about 4.2K. Therefore, the thermal radiation shield is cooled and kept at about 30K. Therefore, thermal radiation shield 42 can isolate the greater part of the radiant heat that might otherwise enter helium chamber 41 from the outside of vacuum container 43. Thus, the helium chamber is sufficiently insulated from the radiant heat.

This modification does not require a refrigerator. Therefore, the cryostat can be designed in a simple construction.

Next, with reference to FIG. 4, a second modification of the invention will be described. The magnet apparatus comprises film sheet 65 serving as a magnetic shield and consisting of a superconducting material (e.g. NbTi). This film sheet 65 is bonded to the external circumferential surface of the cylindrical part of helium chamber 41 and the outer faces of the disc-like end parts thereof. Film sheet 65 may be bonded to the internal cylindrical surface of helium chamber 41. That is, film sheet 65 has only to be cooled by helium chamber 41 and kept in the superconducting state.

When the leakage flux of the static magnetic field permeates film sheet 65, film sheet 65 produces a magnetic flux to offset the leakage flux by the Meissner effect. Thus, the magnetic fringe field is reduced.

This film sheet is extremely light compared with the yoke magnetic shield. This facilitates the transportation and installation of the MRI system. In addition, film sheet 65 is positioned closer than the yoke magnetic shield to superconducting magnet coil 31. For this reason, film sheet 65 can isolate the magnetic fringe field more efficiently than the yoke magnetic field.

Figure 5:
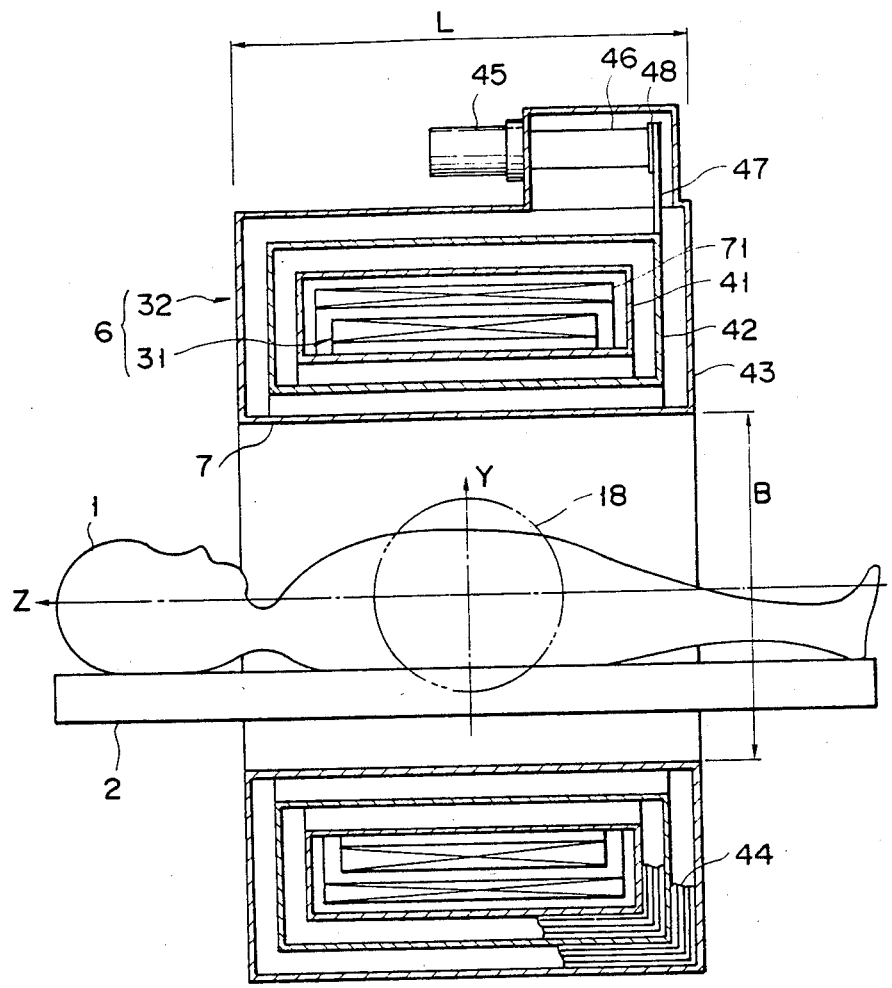
FIG. 5 is a vertical sectional view of the magnet apparatus according to a third modification of this invention.

Referring to FIG. 5, a third modification of this invention will now be described.

In this modification, the magnet apparatus is provided with an active magnetic shield in place of the yoke magnetic shield. This active magnetic shield is constituted of second superconducting coil 71 provided in helium chamber 41 and coaxially with first superconducting coil 31. Second superconducting coil 71 produces a second magnetic field, the direction of which is opposite to the direction of the first magnetic field produced by first superconducting coil 31. Therefore, the leakage fluxes of the two magnetic fields coming out of bore 7 cancel each other. In this manner, the magnetic fringe field is reduced.

Figure 6:
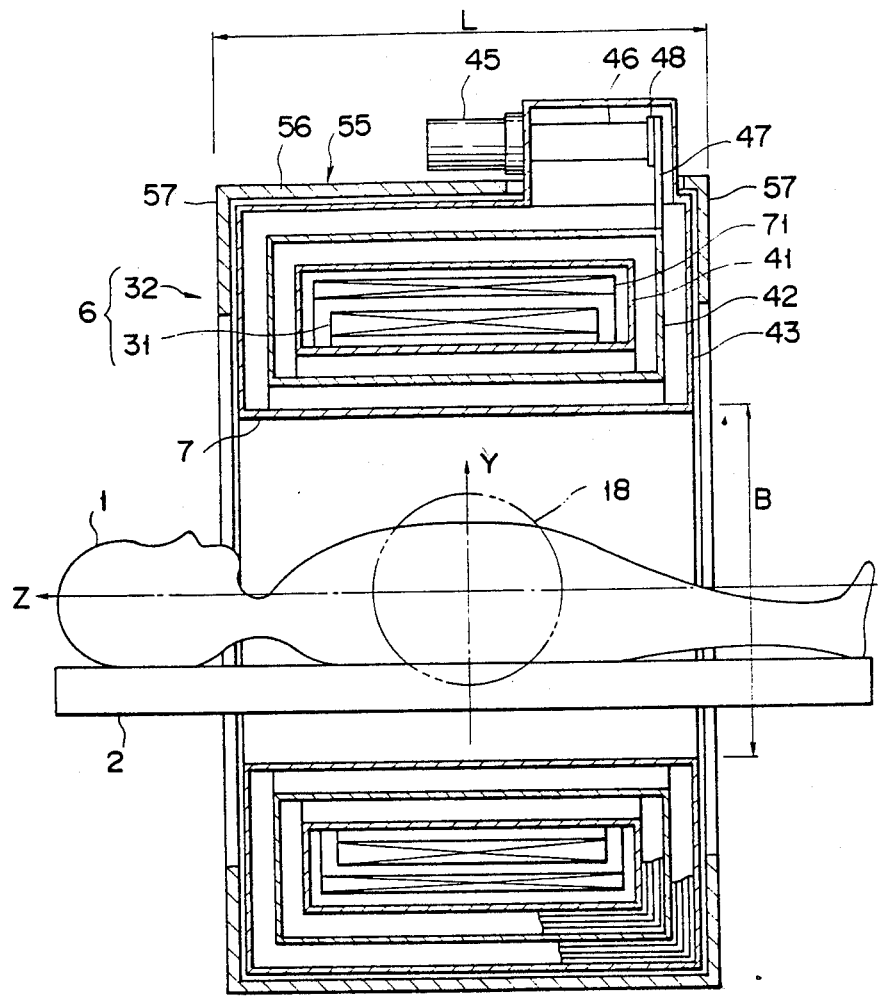
FIG. 6 is a vertical sectional view of the magnet apparatus according to a fourth modification of this invention.

Referring to FIG. 6, a fourth modification of this invention will be described.

In this modification, the magnet apparatus further comprises an active magnetic shield constituted of second superconducting coil 71 in addition to yoke magnetic shield 55. Therefore, the leakage flux of the first magnetic field produced by first superconducting coil, on one hand, and the leakage flux of the second magnetic field, on the other hand, act in opposition to each other and are weakened. The weakened leakage flux is absorbed by yoke magnetic shield 55. Thus, the magnetic fringe field is reduced.

In this modification, the magnet apparatus has a smaller weight than the magnet apparatus comprising only of a yoke magnetic shield. The amount of superconducting wire constituting the superconducting coil may be decreased, thereby reducing the production cost of the MRI system.

What is claimed is:

1. A magnet apparatus for use in magnetic resonance imaging systems, said magnet apparatus having an axis and a bore extending coaxially with the axis and adapted to accommodate an examined body, said bore having the length (L) parallel with the axis and the diameter (B), said magnet apparatus comprising:

a superconducting coil disposed coaxially with the axis and radially outside the bore and capable of producing a main magnetic field inside the bore; and a cryostat having a cylindrical wall which defines the bore such that the dimensions of the bore comply with $1.0 \leq L/B < 1.9$, accommodating said superconducting coil and keeping said coil in the superconducting state, said cryostat including:

a helium chamber containing liquid helium, said helium chamber accommodating said superconducting coil immersed in the liquid helium, thereby keeping said superconducting coil in the superconducting state;

a vacuum container having a vacuum internal space in which said helium chamber is accommodated;

a thermal radiation shield disposed in the internal space of said vacuum container and surrounding said helium chamber; and means for cooling said thermal radiation shield to a specified temperature, whereby said thermal radiation shield cooperates with the internal space of said vacuum container to prevent the greater part of the radiant heat from entering said helium chamber from outside said vacuum container, thus said helium chamber being insulated from the radiant heat.

2. A magnet apparatus according to claim 1, wherein said cooling means includes a refrigerator having a refrigeration stage connected to said thermal radiation shield, whereby said refrigeration stage takes heat from said thermal radiation shield and cools said radiation shield.

3. A magnet apparatus according to claim 1, wherein said cooling means includes a tube fitted closely to said thermal radiation shield, said tube having one end open in said helium chamber and the opposite end open at the outside of said vacuum container, whereby the helium evaporated in said helium chamber passes through said tube and is vented to the outside of said vacuum container, and as it is vented, the evaporated helium cools said thermal radiation shield.

4. A magnet apparatus according to claim 1, wherein said vacuum container has a heat-insulating material filled in its internal space.

5. A magnet apparatus according to claim 1, further comprising a magnetic shield to isolate the flux of the main magnetic field leaking from inside the bore to its outside.

6. A magnet apparatus according to claim 5, wherein said magnetic shield includes a yoke magnetic shield which is made of a ferromagnetic material and is provided outside the cryostat to absorb the leakage flux of the main magnetic field.

7. A magnet apparatus according to claim 5, wherein said magnetic shield includes a film magnetic shield which is fitted closely to said helium chamber, is formed of a superconducting material, and produces a magnetic flux to offset the leakage flux of the main magnetic flux penetrating into the inside of the film magnetic shield.

8. A magnet apparatus according to claim 5, wherein said magnetic shield includes an active magnetic shield constituted of a second superconducting magnet coil which produces in the bore a second magnetic field in the direction opposite to the direction of the main magnetic field, whereby the flux of the main magnetic field and the flux of the second magnetic field, both leaking from inside the bore to its outside, act in opposition to each other and therefore offset each other.

9. A magnet apparatus according to claim 5, wherein said magnetic shield includes:
an active magnetic shield constituted of a second superconducting magnet coil which produces in the bore a second magnetic field in the direction opposite to the direction of the main magnetic field; and
a yoke magnetic shield formed of a ferromagnetic material and provided outside said cryostat;
whereby the flux of the main magnetic field and the flux of the second magnetic field, both leaking from inside the bore to its outside, act in opposition to each other and are thereby weakened and the weakened leakage magnetic flux is absorbed by the yoke magnetic shield.

* * * * *